(12) United States Patent
Bouisse

(10) Patent No.: US 8,552,800 B2
(45) Date of Patent: Oct. 8, 2013

(54) WIRELESS COMMUNICATION DEVICE AND SEMICONDUCTOR PACKAGE DEVICE HAVING A POWER AMPLIFIER THEREFOR

(75) Inventor: Gerard Bouisse, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/258,769

(22) PCT Filed: Apr. 30, 2009

(86) PCT No.: PCT/IB2009/054335
§ 371 (c)(1),
(2), (4) Date: Sep. 22, 2011

(87) PCT Pub. No.: WO2010/125431
PCT Pub. Date: Nov. 4, 2010

(65) Prior Publication Data
US 2012/0038421 A1 Feb. 16, 2012

(51) Int. Cl.
*H03F 3/45* (2006.01)
(52) U.S. Cl.
USPC ............................................. 330/253
(58) Field of Classification Search
USPC ............................................. 330/252–261
See application file for complete search history.

(56) References Cited

U.S. PATENT DOCUMENTS

| 4,193,083 A | 3/1980 | Max |
| 6,734,728 B1 | 5/2004 | Leighton et al. |
| 7,109,793 B2 * | 9/2006 | Nakatani et al. ............. 330/252 |
| 2007/0188240 A1 | 8/2007 | Roach |

FOREIGN PATENT DOCUMENTS

| EP | 1748487 A | 1/2007 |
| WO | 96/06458 A | 2/1996 |
| WO | 00/33378 A | 6/2000 |
| WO | 2006/097893 A | 9/2006 |

OTHER PUBLICATIONS

International Search Report and Written Opinion correlating to PCT/IB2009/054335 dated Mar. 26, 2010.

* cited by examiner

Primary Examiner — Hieu Nguyen

(57) ABSTRACT

A semiconductor package device comprises a first amplifier block, at least one further amplifier block, and at least one differential inductance operably coupled between a first plurality of elements of the output of a first active component of the first amplifier block and a second plurality of elements of the output of a first active component of the at least one further amplifier block. The differential inductance is arranged such that a uniform inductance is provided between the first plurality of elements of the first active component of the first amplifier block and the second plurality elements of the second active component of the at least one further amplifier block.

19 Claims, 7 Drawing Sheets

WIRELESS COMMUNICATION DEVICE AND SEMICONDUCTOR PACKAGE DEVICE HAVING A POWER AMPLIFIER THEREFOR

FIELD OF THE INVENTION

The field of this invention relates to radio frequency (RF) power amplifiers (PAs) and semiconductor package device therefor. The invention is applicable to, but not limited to, a semiconductor package device comprising two or more amplifier blocks.

BACKGROUND OF THE INVENTION

In the field of wireless communication, for many applications, such as within a cellular radio infrastructure, radio frequency (RF) power amplifiers (PAs) are continuously being required to support increasingly greater instantaneous bandwidths. The instantaneous bandwidth, or video bandwidth as it is often referred to, is the maximum signal bandwidth that an amplifier is able to properly amplify a communication signal. In particular, the progressive generations of wireless communication standards, such as the Global System for Mobile Communication (GSM) standard and the more recent $3^{rd}$ Generation Partnership Project (3GPP) standard, have successively required increased bit rates. Accordingly, each generation has required an increased instantaneous bandwidth, and the future generations being considered are requiring that these bit rates are extended even further.

FIG. 1 illustrates schematically a typical example of a RF PA circuit 100 comprising a first power amplifier block 110 and a second power amplifier block 120 operably coupled in parallel between inputs 102, 104 and outputs 170, 175 respectively, for example as may be used within RF integrated circuits (RFICs). Each power amplifier block 110, 120 comprises an input matching circuit 130, 140 operably coupling the respective RF input signal 102, 104 to a respective RF PA transistor 112, 122. The output of a drain port of each RF PA transistor 112, 122 is operably coupled to an output matching circuit 150, 160. The RF PA circuit 100 may be configured to operate as a push-pull (differential) amplifier, whereby inputs 102, 104 comprise differential inputs and the outputs 170, 175 comprise differential outputs. Equally, the RF PA circuit may be configured as a single ended amplifier circuit by operably coupling together the two inputs 102, 104 and the two outputs 170, 175 respectively.

A problem with this known RF PA design, in either the differential configuration or the single ended configuration, is that the instantaneous bandwidth is limited by capacitors 155, 165 within the output matching circuits 150, 160, typically to an instantaneous bandwidth of no more than around 30 MHz. Capacitors 155, 165 provide DC blocking for the respective shunt inductances 157, 167, whilst providing a short circuit for RF frequency signals such that the parallel reactance at such RF frequencies on the drain port of the respective transistor 112, 122 comprises an inductance. Typically the capacitors 155, 165 comprise a capacitance value in the region of 200 pF. Lower value capacitances are typically unsuitable since they cannot provide a good enough radio frequency (RF) short. However, existing semiconductor technologies prevent higher value capacitances from being used because of restrictions in capacitance density. This limitation to the value of capacitors 155, 165 limits the instantaneous bandwidth achievable, thus restricting the suitability of such an amplifier circuit for present and future RF PA drain modulation systems. In addition, the lossy nature of the capacitors 155, 165 affects the peak efficiency of the amplifier circuit 100 (by a few percent). Furthermore, the single ended configuration is sensitive to ground connection inductance, which affects unit-to-unit (e.g. RF integrated circuit) RF performance dispersion.

SUMMARY OF THE INVENTION

The present invention provides a semiconductor package device and a wireless communication device comprising such a semiconductor package device as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and examples of the invention will be described, by way of example only, with reference to the drawings. Elements in the figures are illustrated for simplicity and clarity and have not necessarily been drawn to scale.

DETAILED DESCRIPTION

Examples of the invention will be described with respect to an implementation of a radio frequency (RF) semiconductor package device, for example one that is suitable for use in a wireless communication unit, for example a cellular base station although the examples may readily be applied to a lower power PA design for, say, a subscriber wireless communication unit such as a mobile phone. In this manner, examples are described herein with respect to implementing, say, an 80 W base station using laterally diffused metal oxide semiconductor (LDMOS) technology. Examples of the invention will also be described with respect to a semiconductor package device comprising two or more single ended amplifier blocks. However, it is envisaged that amplifier blocks other than single-ended amplifier blocks may be used in other examples. Thus, the term 'amplifier block' used hereinafter may encompass any other amplifier type. In addition, the term 'power transistor' used hereinafter may encompass any other power amplifier transistor, such as much lower power transistors, for example those suitable for use in mobile phone technology, where the output power may be of the order of, say 1 W. Furthermore, examples of the invention are suitable in non-final PA stages, such as for use in pre-amplifier networks. In addition, examples of the invention may be implemented in any type of RF amplifier semiconductor device package. Examples of the invention may also be implemented with any type of RF transistor technology, such as Laterally Diffused Metal Oxide Semiconductor (LDMOS), gallium nitride (GaN), bipolar technology, etc.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 2:
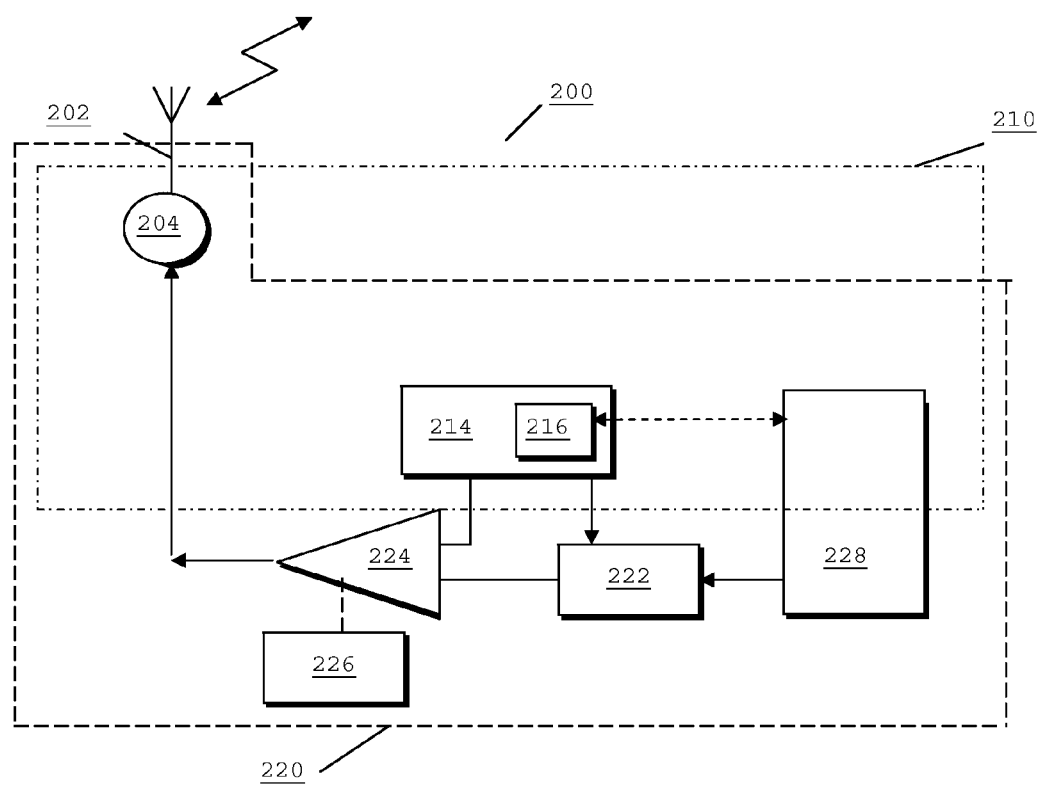
FIG. 2 illustrates an example of a block diagram of a wireless communication unit.

Referring now to FIG. 2, an example of a block diagram of a wireless communication unit 200 is illustrated that is capable of using a radio frequency (RF) power amplifier integrated circuit (PAIC) as hereinafter described with reference to some examples of the invention. For the sake of clarity, the wireless communication unit 200 is shown as divided into two distinct portions—a receiver chain 210 (which will not be described for clarity purposes) and a transmitter chain 220. The wireless communication unit 200 contains an antenna coupled to an antenna switch 204 that provides signal control of RF signals in the wireless communication unit 200, as well as isolation between the receiver chain 210 and transmit chain 220. The antenna switch 204 may be replaced with a duplex filter, for frequency duplex communication units, as known to those skilled in the art.

With regard to the transmit chain 220, this essentially includes a signal processor 228, operably coupled to a modulation and up-converter circuit 222 and power amplifier (PA) module 224. A power source 226 is operably coupled to the PA module 224. The signal processor 228 and modulation and up-converter circuit 222 are operationally responsive to a controller 214. A timer 216 is operably coupled to the controller 214 to control the timing of operations, namely the transmission or reception of time-dependent signals. The power amplifier module 224 comprises a power amplifier integrated circuit (PAIL) being provided with a voltage source 226 and comprising a plurality of active components, for example power transistors, and associated RF matching components, for example as described in greater detail with respect to FIG. 3.

In summary, in one example there is provided a semiconductor package device comprising a first amplifier block, at least one further amplifier block and a differential inductance operably coupled between a plurality of elements of each of the outputs of the respective active components of the first amplifier block and the at least one further amplifier block. The differential inductance is arranged such that a substantially uniform inductance is provided between the elements of the first amplifier block and the elements of the at least one further amplifier block. Hereinafter, the term 'uniform' related to inductance of the differential inductance, is meant to encompass any substantially uniform inductance created between the elements of the first amplifier block and the elements of the at least one further amplifier block that facilitates the aims of the invention, within any reasonable manufacturing and design tolerance. Similarly, and hereinafter, the term 'non-uniform' as related to the configuration of successive, adjacent wire-bonding arrays, is meant to encompass any substantially non-uniform configuration that facilitates the aims of the invention in providing a substantially uniform inductance using substantially non-uniform wire-bonding lengths within any reasonable manufacturing and/or design tolerance.

Figure 3:
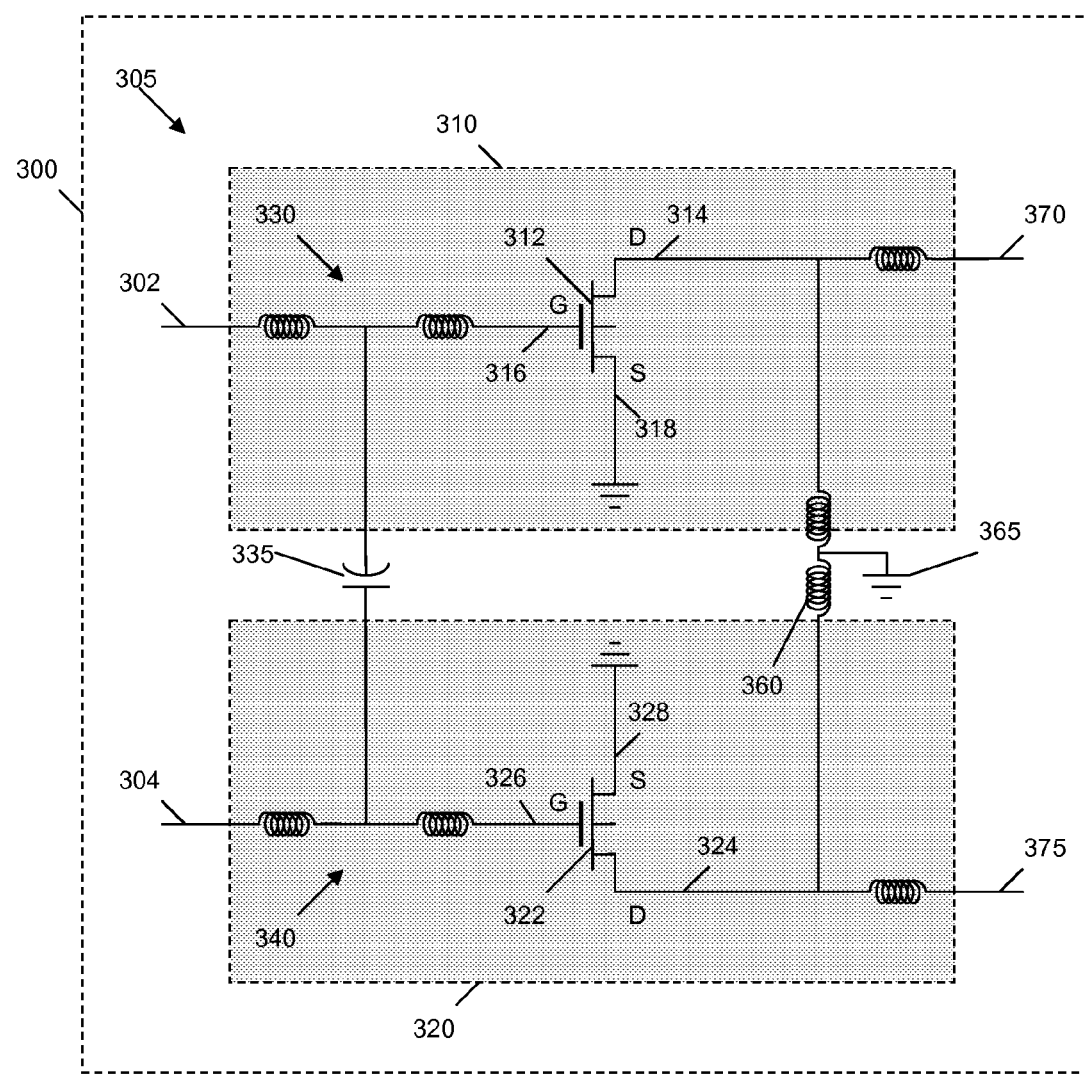
FIG. 3 illustrates an example of a semiconductor package device.

Referring now to FIG. 3 there is illustrated an example of such a semiconductor package device 300, for example in a form of a power amplifier integrated circuit (PAIL) or the like. The semiconductor package device 300 comprises a first amplifier block 310 and at least one further amplifier block 320, for example which form part of a Radio Frequency (RF) Power Amplifier (PA) device. The exemplary semiconductor package device described herein, and illustrated in the accompanying drawings, comprises only two amplifier blocks for clarity purposes. Further amplifier blocks may also be operably coupled in parallel in further exemplary semiconductor package devices in the same manner. For the example illustrated in FIG. 3, the amplifier blocks 310, 320 form part of a differential amplifier circuit 305, and as such are configured to operate as a push-pull (differential) amplifier. Accordingly, the amplifier blocks 310, 320, which individually comprise single ended amplifier blocks, are operably coupled in parallel between differential inputs 302, 304 and differential outputs 370, 375 of the differential amplifier circuit 305.

Figure 1:
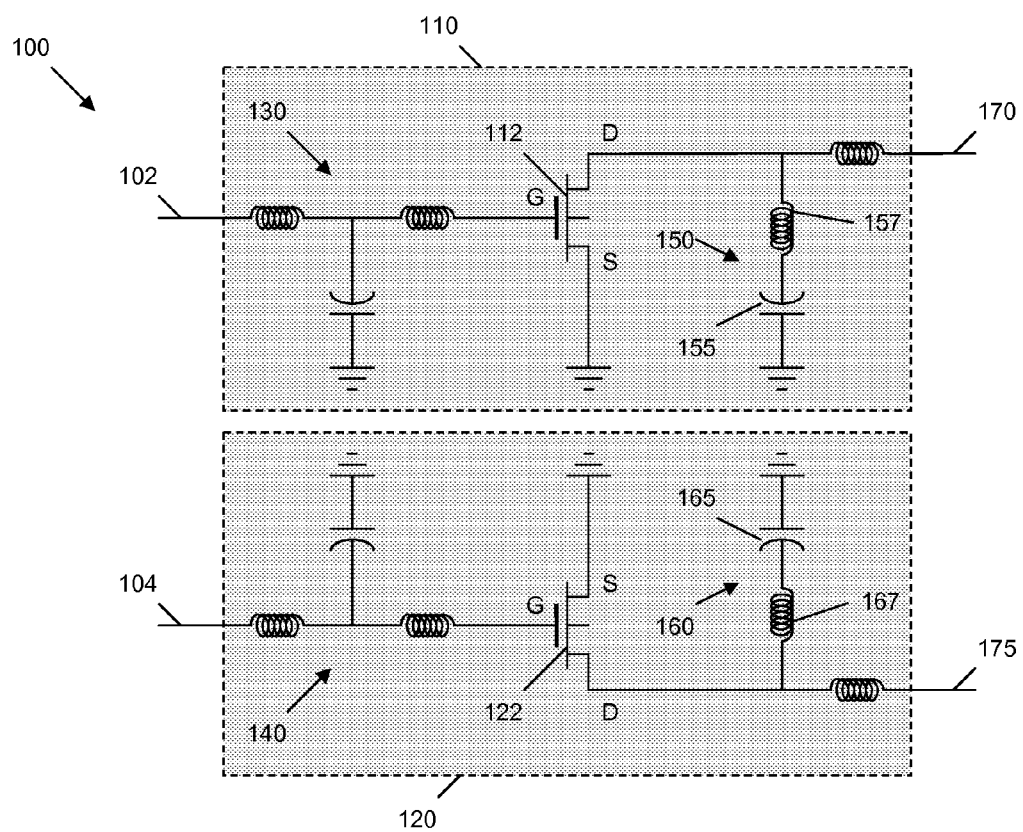
FIG. 1 illustrates a known RF PA circuit.

Each of the first and at least one further amplifier blocks 310, 320 comprises an active component in the form of a respective power transistor 312, 322. In particular for the illustrated example, the active component of each amplifier block 310, 320 comprises a field effect transistor in the form of a laterally diffused metal oxide semiconductor (LDMOS) power transistor 312, 322 comprising a gate terminal 316, 326 providing an input for the power transistor, a drain terminal 314, 324 providing an output for the power transistor, and a common source terminal 318, 328 operably coupled to ground. Thus, for the illustrated example, each amplifier block 310, 320 is configured in accordance with a drain modulated amplifier system. The amplifier blocks 310, 320 each further comprise an input matching circuit 330, 340 operably coupled between respective inputs 302, 304 and the input (gate) 316, 326 of the respective power transistor 312, 322. For the illustrated example, the input matching circuits 330, 340 are operably coupled to one another via capacitance 335. Thus, all shunt elements are replaced by differential elements, for example the input shunt capacitors in the prior art parallel single-ended amplifier shown in FIG. 1 are replaced by a single input shunt capacitor in the push-pull (sometimes referred to as differential) amplifier shown in FIG. 3. The amplifier blocks 310, 320 further comprise output matching circuits operably coupled together using a differential inductance 360 operably coupled between the outputs (drains) 314, 324 of the transistors 312, 322. FIG. 3 also illustrates a mid-point of the differential inductance 360 being operably coupled to a virtual ground 365.

The amplifier blocks 310, 320 of FIG. 3 may be formed on a single die within the respective semiconductor package devices 300. Alternatively, the amplifier blocks 310, 320 may be formed on separate dies within the semiconductor package device 300.

Figure 4:
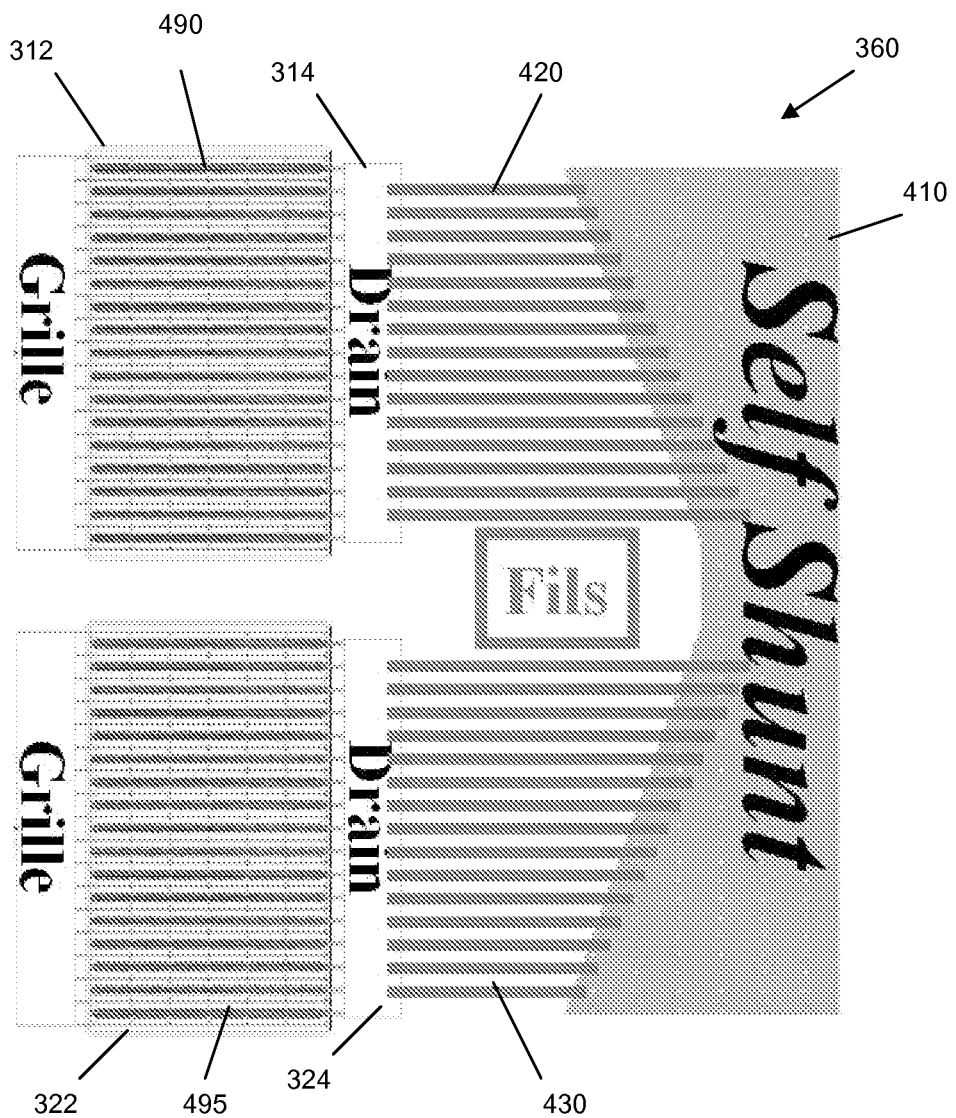
FIGS. 4 to 6 illustrate an example of a true high power differential power amplifier.

Referring now to FIG. 4, there is illustrated an example of the differential inductance 360 of FIG. 3. As previously mentioned, the differential inductance 360 is operably coupled between the outputs (drains) 314, 324 of the transistors 312, 322. Ports of high power devices, such as power transistors 312, 322 typical comprise an array of elements, or fingers, often numbering in the hundreds. Accordingly, and as illustrated in FIG. 4, the output (drain) 314, 424 of each of the power transistors 312, 322 comprises a plurality of elements 490, 495, to which the differential inductance 360 of FIG. 3 is operably coupled. For the illustrated example, the differential inductance comprises a first non-uniform wire-bonding array 420 operably coupled to the plurality of elements 490 of the output 314 of the transistor 312. The differential inductance further comprises at least one further non-uniform wire-bonding array 430 operably coupled to the plurality of elements 495 of the output 324 of the transistor 322. The differential inductance illustrated in FIG. 4 further comprises a microstrip line 410, for example in a form of a simple printed line on a substrate of the semiconductor package device 300 of FIG. 3. The microstrip line 410 is operably coupled to the plurality of elements 490, 495 of the outputs 314, 324 of the respective active components 312, 322 by way of the non-uniform wire-bonding arrays 420, 430. In this manner, the elements 490 of the output 314 of active component 312 are operably coupled to the elements 495 of the output 324 of active component 322 via the microstrip line 410 and wire-bonding arrays 420, 430.

The non-uniform wire-bonding arrays are arranged, in conjunction with the microstrip line 410 for the illustrated example, such that a substantially uniform inductance is provided between the elements 490 of the first amplifier block 310 and the elements 495 of the at least one further amplifier block 320. For example, referring to FIG. 5 and FIG. 6 the differential inductance 360 is illustrated, with only two bonding wires for each of the wire-bonding arrays 420, 430 being illustrated for clarity. As previously mentioned, the microstrip line 410 is operably coupled to the plurality of elements 490 and 495 of the outputs 314, 324 of the respective active components 312, 322 by way of the non-uniform wire-bonding arrays 420, 430.

Figure 5:
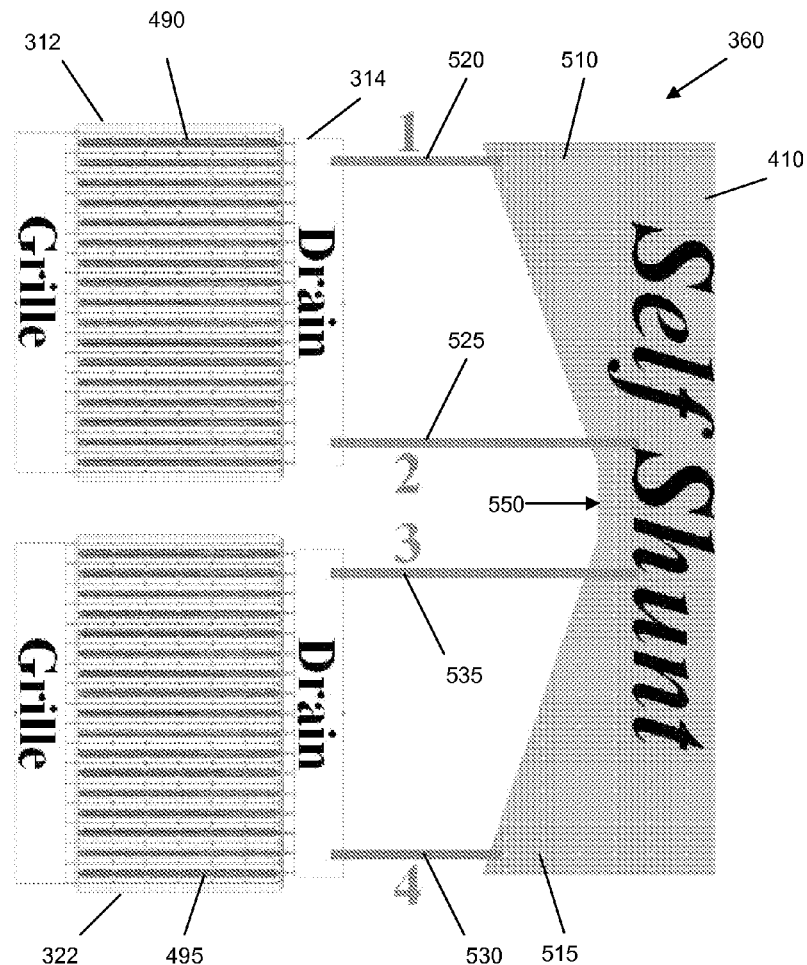
Figure 6:
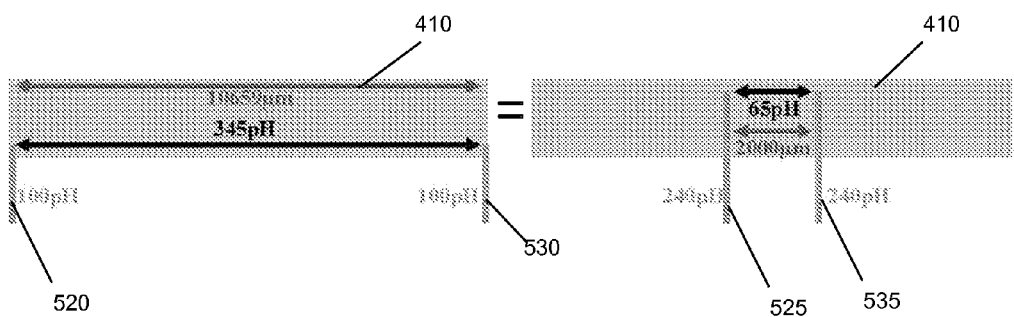

Referring now to FIGS. 5 and 6, a first bonding wire 520 of the wire-bonding array 420 of FIG. 4 is operably coupled between the output 314 of active component 312 and a point proximate a first end 510 of the microstrip line 410, and a second bonding wire 525 of the wire-bonding array 420 is operably coupled between the output 314 of active component 312 and a point located generally between the first end 510 of the microstrip line 410 and a central point 550 thereof. Similarly, a first bonding wire 530 of the wire-bonding array 430 of FIG. 4 is operably coupled between the output 324 of active component 322 and a point proximate a second end 515 of the microstrip line 410, and a second bonding wire 535 of the wire-bonding array 430 of FIG. 4 is operably coupled between the output 324 of active component 314 and a point located generally between the second end 515 of the microstrip 410 and the central point 550 thereof.

For the illustrated example, the length of each bonding wire 520, 525, 530, 535 is configured in accordance with a distance between the point at which that bonding wire 520, 525, 530, 535 is operably coupled to the microstrip line 410 and a common point thereof, for example the central point 550, such that a uniform inductance is achieved between the output 314, 324 of the respective active component 312, 322 and that common point via each bonding wire within the respective wire-bonding array 420, 430 of FIG. 4. As a result, a substantially uniform inductance may be provided between the output 314 of active component 312 and the output 324 of active component 322 through all bonding wire paths there between.

For example, and as illustrated in FIG. 6, the inductance within the microstrip 410 between the respective points at which bonding wires 520 and 530 are operably coupled and the central point 550 may comprise, in this example, 172.5 pH. The lengths of bonding wires 520, 530 may be arranged such that each bonding wire comprises an inductance of approximately 100 pH, giving a total combined inductance for that path of 545 pH (2*(172.5+100). Conversely, the inductance within the microstrip 410 between the respective points at which bonding wires 525 and 535 are operably coupled and the central point 550 may comprise 32.5 pH. Accordingly, the lengths of bonding wires 525, 535 may be arranged such that each bonding wire comprises an inductance of approximately 240 pH, also giving a total combined inductance for that path of 545 pH (2*(32.5+240). In this manner, the virtual ground 365 may be created substantially at the central point 550.

Thus, by arranging the differential inductance such that a substantially uniform inductance is provided between the elements of the first amplifier block and the elements of the at least one further amplifier block, a proper power combination may be achieved between the active elements through the differential inductance. In addition, the output matching circuits for the amplifier blocks, which are provided by the differential inductance 360, are advantageously free from capacitances. As a result, an instantaneous bandwidth exceeding 100 MHz is achievable (compared to 30 MHz for the prior art design).

Figure 9:
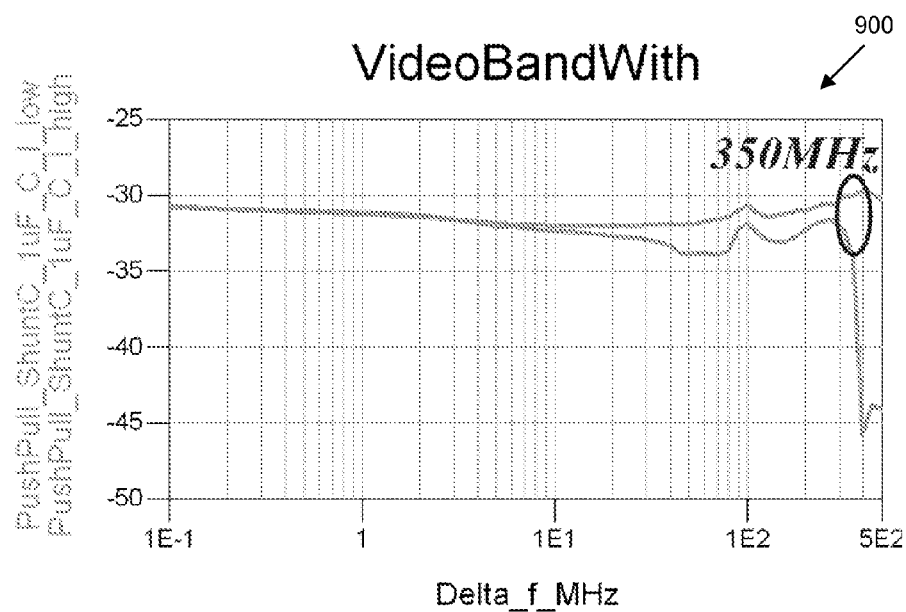

In one example implementation, a large value capacitor may be used to de-couple the output of the transistors to ground, as illustrated in FIG. 9. In yet another example, the power amplifier semiconductor device package may be applied to other frequencies, for example 1 GHz or above power amplifier designs. In such higher frequency examples, the non-uniform wire-bonding may be replaced using ribbon technology.

Furthermore, in another example, the power amplifier semiconductor device package may be applied to higher or lower output powers, for example 1 W power amplifier designs instead of 10 W designs, where there may be a higher contribution of microstrip lines. In addition, in another example, depending upon the frequency, required output power and physical dimensions of the power transistors, the achieving of some form of inductance may utilise other forms of routing radio frequency signals, such as a meandering transmission line of any shape or general direction. In other examples, the non-uniform wire-bonding may be replaced or supplemented with a ball-grid array, for example using printed transmission lines. The absence of capacitances within the output matching circuits may enable an improvement in the peak power efficiency to be achieved.

Figure 7:
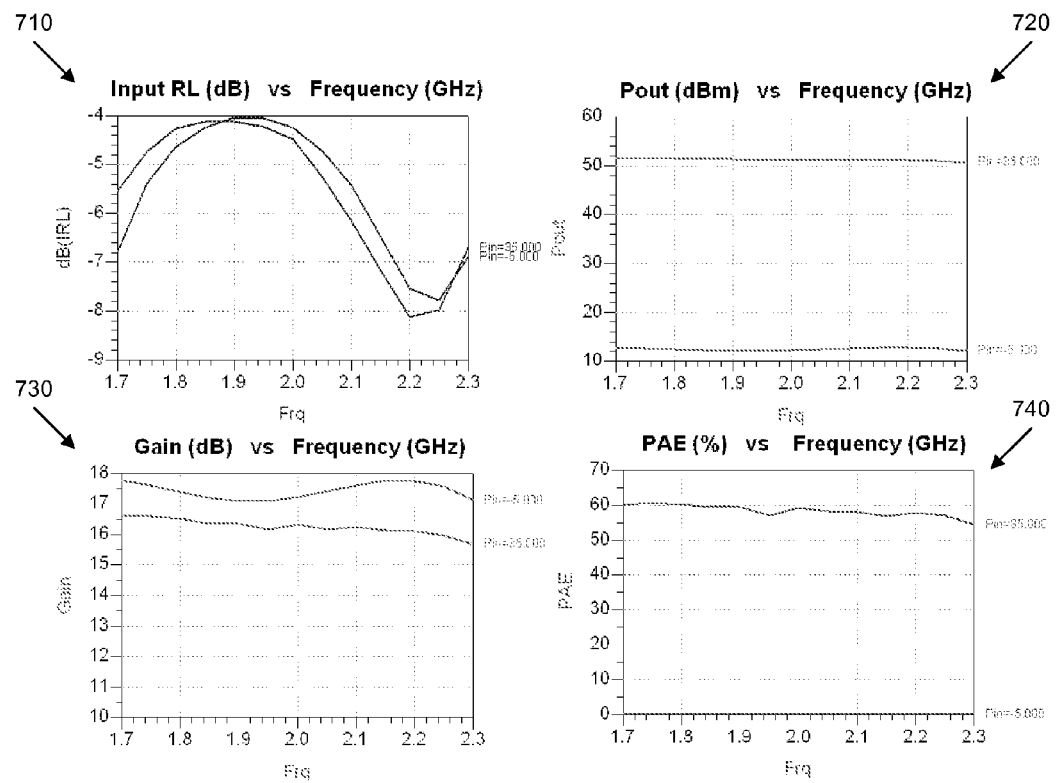
FIG. 7 illustrates examples of graphs showing RF performance of an RF PA arrangement.

Referring now to FIG. 7, there is illustrated four graphs 710, 720, 730, 740 showing RF performance of the aforementioned examples of an RF power amplifier such as the power amplifier arrangement illustrated in FIG. 3. The graphs of FIG. 7 show input matching return loss (RL) 710, output power at 1 dB compression (POUT) 720, small signal gain at 1 dB compression 730 and Power Added Efficiency (PAE) 740 over a frequency bandwidth of 600 MHz. This is in contrast to conventional RF power amplifier arrangements, which are only capable of achieving similar performance characteristics over a much narrower frequency bandwidth of around 60 MHz.

Figure 8:
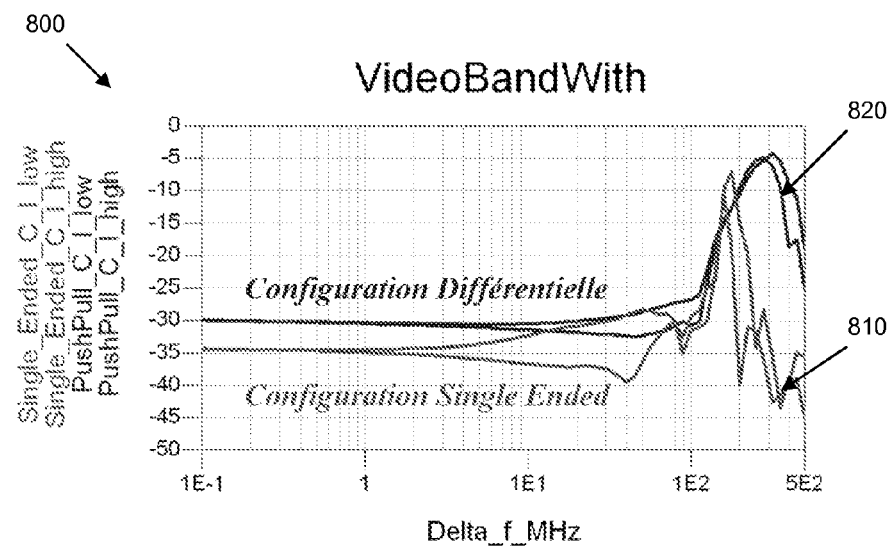
FIGS. 8 and 9 illustrate examples of graphs showing video bandwidth capability of RF PA arrangements.

Referring now to FIG. 8, there is illustrated a graph 800 showing an example of video bandwidth capability for the aforementioned examples of an RF power amplifier arrangement, such as the power amplifier arrangement illustrated in FIG. 3. In particular, the graph 800 illustrates an example of the performance of a single ended configuration 810 of such a power amplifier arrangement and an example of the performance of a differential (push-pull) configuration 820 of such a power amplifier arrangement.

Referring now to FIG. 9, there is illustrated a graph 900 showing an example of video bandwidth for the aforementioned examples of an RF power amplifier arrangement, such as the power amplifier arrangement illustrated in FIG. 3. More particularly, the graph 900 shows an example of video bandwidth for such an RF amplifier arrangement wherein the virtual ground 365 of the differential inductance is decoupled by way of a large value capacitance, for example as illustrated in FIG. 7. In this manner, graph 900 illustrates an advantage of decoupling the virtual ground 365 in terms of improving the insensitivity to ground connection inductance resulting from the differential inductance 360.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

The semiconductor substrate described herein can be any semiconductor material or combinations of materials, such as gallium arsenide, silicon germanium, silicon-on-insulator (SOI), silicon, monocrystalline silicon, the like, and combinations of the above.

The conductors as discussed herein may be illustrated or described in reference to being a single conductor, a plurality of conductors, unidirectional conductors, or bidirectional conductors. However, different examples may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the examples of the invention described herein are, for example, capable of operation in other orientations than those illustrated or otherwise described herein.

It is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediary components. Likewise, any two components so associated can also be viewed as being "operably connected," or "operably coupled," to each other to achieve the desired functionality.

Also for example, in one example, the illustrated amplifier blocks 310, 320 of FIG. 3 are located on a single integrated circuit or within a same device. Alternatively, amplifier blocks 310, 320 may include any number of separate integrated circuits or separate devices interconnected with each other. Furthermore, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A semiconductor package device comprising:
   a first amplifier block;
   at least one further amplifier block; and
   at least one differential inductance operably coupled between a first plurality of elements of an output of a first active component of the first amplifier block and a second plurality of elements of an output of a second active component of the at least one further amplifier block; wherein
   the differential inductance is arranged such that a uniform inductance is provided between the first plurality of elements of the first active component of the first amplifier block and the second plurality of elements of the second active component of the at least one further amplifier block, wherein the differential inductance comprises a number of non-uniform wire bonding arrays.

2. The semiconductor package device of claim 1, wherein the differential inductance comprises a microstrip line the microstrip line being operably coupled to the first and second plurality of elements of the outputs of the respective first and second active components by way of the non-uniform wire-bonding arrays.

3. The semiconductor package device, of claim 1, wherein the first amplifier block and the at least one further amplifier block form part of a differential amplifier circuit, and are operably coupled in parallel between differential inputs and differential outputs of the differential amplifier circuit.

4. The semiconductor package device of claim 1, wherein the first amplifier block and the at least one further amplifier block each comprise a field effect transistor.

5. The semiconductor package device of claim 1, wherein the first amplifier block and the at least one further amplifier block are configured in accordance with a drain modulated amplifier system.

6. The semiconductor package device of claim 1, wherein the first amplifier block and the at least one further amplifier block each comprise a laterally diffused metal oxide semiconductor (LDMOS) device.

7. The semiconductor package device of claim 1, wherein the first amplifier block and the at least one further amplifier block form part of a Radio Frequency (RF) Power Amplifier (PA) device.

8. The semiconductor package device of claim 1, wherein the first amplifier block and the at least one further amplifier block are formed on a single die within the semiconductor package device.

9. The semiconductor package device of claim 1, wherein the first amplifier block and the at least one further amplifier block formed on separate dies within the semiconductor package device.

10. A wireless communication device, comprising:
a first amplifier block;
at least one further amplifier block; and
at least one differential inductance operably coupled between a first plurality of elements of an output of a first active component of the first amplifier block and a second plurality of elements of an output of a second active component of the at least one further amplifier block; wherein
the differential inductance is arranged such that a uniform inductance is provided between the first plurality of elements of the first active component of the first amplifier block and the second plurality of elements of the second active component of the at least one further amplifier block, wherein the differential inductance comprises a number of non-uniform wire bonding arrays.

11. The semiconductor package device of claim 2, the non-uniform wire-bonding arrays comprise bonding wires, each of said bonding wire having a length in accordance with a distance between the point at which that bonding wire is operably coupled to the microstrip line and a common point thereof.

12. The semiconductor package device of claim 1 wherein the first amplifier block and the at least one further amplifier block form part of a differential amplifier circuit, and are operably coupled in parallel between differential inputs and differential outputs of the differential amplifier circuit.

13. The semiconductor package device of claim 1, wherein the first amplifier block and the at least one further amplifier block are configured in accordance with a drain modulated amplifier system.

14. The semiconductor package device of claim 2, wherein the first amplifier block and the at least one further amplifier block are configured in accordance with a drain modulated amplifier system.

15. The semiconductor package device of claim 3, wherein the first amplifier block and the at least one further amplifier block are configured in accordance with a drain modulated amplifier system.

16. The semiconductor package device of claim 1, wherein the first amplifier block and the at least one further amplifier block each comprise a laterally diffused metal oxide semiconductor (LDMOS) device.

17. The semiconductor package device of claim 3, wherein the first amplifier block and the at least one further amplifier block each comprise a laterally diffused metal oxide semiconductor (LDMOS) device.

18. The semiconductor package device of claim 1, wherein the first amplifier block and the at least one further amplifier block-form part of a Radio Frequency (RF) Power Amplifier (PA) device.

19. The semiconductor package device of claim 3, wherein the first amplifier block and the at least one further amplifier block-form part of a Radio Frequency (RF) Power Amplifier (PA) device.

* * * * *